United States Patent [19]
Ahn et al.

[11] Patent Number: 5,867,426
[45] Date of Patent: Feb. 2, 1999

[54] METHOD OF PROGRAMMING A FLASH MEMORY CELL

[75] Inventors: Byung Jin Ahn; Myong Seob Kim; Jea Chun Ahn, all of Seoul; Jea Hyun Sone, Suwon, all of Rep. of Korea

[73] Assignee: Hyundai Electronics Industries Co., Ltd., Kyungki-Do, Rep. of Korea

[21] Appl. No.: 831,044

[22] Filed: Apr. 1, 1997

[30] Foreign Application Priority Data

Apr. 1, 1996 [KR] Rep. of Korea ............. 1996-9730

[51] Int. Cl.$^6$ ....................................... G11C 7/00
[52] U.S. Cl. ........................ 365/185.18; 365/185.14; 365/185.15; 365/185.26; 365/185.33
[58] Field of Search .............. 365/185.18, 185.15, 365/185.14, 185.26, 185.33

[56] References Cited

U.S. PATENT DOCUMENTS

| | | | |
|---|---|---|---|
| 5,324,998 | 6/1994 | Powell | 307/465 |
| 5,349,220 | 9/1994 | Hong | 257/322 |
| 5,444,655 | 8/1995 | Yoshikawa | 365/185.18 X |
| 5,483,484 | 1/1996 | Endoh et al. | 365/185.18 |
| 5,491,657 | 2/1996 | Haddad et al. | 365/185.18 X |
| 5,511,021 | 4/1996 | Bergemont et al. | 365/185.18 X |

*Primary Examiner*—Do Hyun Yoo
*Attorney, Agent, or Firm*—Cohen, Pontani, Lieberman, Pavane

[57] ABSTRACT

A method of programming a flash memory cell which increases programming efficiency and characteristics. A depletion area formed at a source region is extended from a surface portion of a silicon substrate to the bottom portion of the silicon substrate. A minority carrier produced at a trap center existing at the extended depletion area receives energy from a high electric field area formed at the silicon substrate between a select gate and floating gate. The minority carrier is then changed into a hot electron by a voltage applied to a drain region. The electron is injected into a floating gate by a vertical direction electric field formed by a high potential voltage applied to a control gate.

6 Claims, 4 Drawing Sheets

METHOD OF PROGRAMMING A FLASH MEMORY CELL

BACKGROUND OF INVENTION

1. Field of the Invention

The present invention relates to a method of programming a flash memory cell and, in particular, to a method of programming a flash memory cell which can reduce the size and implement a low power device.

2. Brief Description of the Prior Art

In general, the flash memory device such as a flash electrically erasable and programmable read only memory cell (EEPROM) has functions of electrically programming and erasing, and is classified into a stack-gate type and split-gate type depending on the shape of a constructed gate electrode.

Now, the structure and operation of conventional stack-gate type and split-gate type flash memory cells will be described below.

In the conventional stack-gate type flash memory cell, as shown in FIG. 1, a tunnel oxide film 4, floating gate 5, dielectric film 6 and control gate 7 are sequentially stacked on a silicon substrate 1, and a source and drain regions 2 and 3 are formed in the silicon substrate 1 on both sides of the floating gate 5, respectively. The operation of programming and erasing of the flash memory cell as described above is as follows.

To program an information to the flash memory cell, that is, to charge the floating gate 5 with an electric charge, +12 V is applied to the control gate 7, +5 V is applied to the drain region 3, and the ground voltage is applied to the source region 2 and silicon substrate 1 as shown in FIG. 2A. Then, a channel is formed in the silicon substrate 1 below the floating gate 5 due to the high voltage applied to the control gate 7, and the high electric field zone is formed in the silicon substrate 1 at the side of the drain region 3 due to the voltage applied to the drain region 3. At this time, a part of electrons existing in the channel receive the energy from the high electric field zone so as to be hot electrons, and a part of the hot electrons are injected to the floating gate 5 through the tunnel oxide film 4 by a vertical direction electrical field formed due to the high voltage applied to the control gate 7. Therefore, the threshold voltage ($V_T$) of the flash memory cell rises due to the injection of the hot electron.

To erase the information programmed in the flash memory cell, that is, to discharge the electric charge stored in the floating gate 5, the ground voltage is applied to the control gate 7 and the silicon substrate 1, +12 V is applied to the source region 2, and the drain region 3 is floated as shown in FIG. 2B. Then, the electrons injected into the floating gate 5 are moved to the source region 2 due to the F-N (fowler-nordheim) tunneling phenomenon, whereby the threshold voltage $V_T$ of the memory cell is lowered.

The operation of erase of the flash memory cell is effectuated by the tunneling phenomenon which occurs locally between the source region 2 and the floating gate 5. Therefore, it is difficult to control the amount of electrons which moves to the source region 2 at the time of operation of erase, and a phenomenon that the floating gate 5 is not electrically recovered, that is, an over erasure occurs in case where the characteristics of the tunnel oxide film 4 is degraded. Such over erasure acts as a cause for degradation of the operational characteristics of the device.

On the other hand, in the split-gate type flash memory cell as shown in FIG. 3, a first insulating film 14, floating gate 15, second insulating film 16 and control gate 17 are sequentially stacked on a silicon substrate 11, and a third insulating film 18 and select gate 19 are stacked on the entire structure including such stack structure. A drain region 13 is formed in the silicon substrate 11 below one side of the floating gate 15, and a source region 12 is formed in the silicon substrate 11 spaced a predetermined distance from the floating gate 15.

The operation of programming and erasing the flash memory cell consisting of a gate electrode of such stack structure and a select transistor is as follows.

To program an information to the flash memory cell, that is, to charge the floating gate 15 with an electric charge, +12 V is applied to the control gate 17, +1.8 V is applied to the select gate 19, +5 V is applied to drain region 13, and the ground voltage is applied to the source region 12 and silicon substrate 11 as shown in FIG. 4A. Then, a select channel is formed in the silicon substrate 11 below the select gate 19 due to the voltage applied to the select gate 19, and a channel is formed in the silicon substrate 11 below the floating gate 15 due to the high voltage applied to the control gate 17. A drain current of 20 to 30 $\mu$A flows through the select channel and at the same time a high electric field zone is formed in the channel below the floating gate 15. At this time, a part of electrons existing in the channel receive the energy from the high electric field zone so as to be hot electrons, and a part of the hot electrons are injected to the floating gate 15 through the first insulation film 14 by a vertical direction electric field formed due to the high voltage applied to the control gate 17. Therefore, the threshold voltage $V_T$ of the flash memory cell rises.

To erase the information programmed in the flash memory cell, that is, to discharge the electric charge stored in the floating gate 15, −12 V is applied to the control gate 17, +5 V is applied to the drain region 13, the ground voltage is applied to the select gate 19 and silicon substrate 11, and the source region 12 is floated, as shown in FIG. 4B. Then, the electrons injected into the floating gate 15 are moved to the source region 12 due to the F-N tunneling phenomenon, whereby the threshold voltage $V_T$ of the memory cell is lowered.

The read operation of the split-gate type flash memory cell is performed under the condition that the select transistor is turned-on. Therefore, it has an advantage in that the over-erasure phenomenon does not occur. However, since a leakage current can occur in case where the length of the select gate is reduced, it is difficult to reduce the size of memory cell.

In addition, the high voltage of 12 V or higher is applied to the control gate of the stack-gate type and split-gate type flash memory cell, and such high voltage is supplied from a charge pumping circuit which raises the power source voltage of about 5 V to the high voltage. Therefore, the flash memory device consisting of such memory cell has problems in that, first, a long hour is required for programming and the power consumption is large since a lot of time is required for the pumping operation which raises the power source voltage to the high voltage, and second, there is a difficulty in the manufacturing processes since the thickness of the second insulating film formed between the floating gate and the control gate must be more than two times thicker than that of the first insulating film to secure the reliability of the device.

Furthermore, recently, a low power memory device which uses the low voltage of 3.3 V or 2.5 V is required, and a method of reducing the voltage applied to the drain region at the time of programming is suggested as a method of implementing the low power memory deice. However, in case of using such method, the structure of the memory cell or drain junction must be changed to maintain the program characteristics to the same level as that of the conventional memory device using the power source voltage (for example, 5 V). Therefore, problems such as change in manufacturing processes and increase in process steps according to such change occurs.

In addition, as the other method of implementing the low power memory device, a method of adding a charge pumping circuit to the memory device to raise the voltage applied to the drain region at the time of programming to more than 5 V. However, this method also has a problem that the rise of drain potential by the charge pumping is impossible due to the drain current of 30 $\mu$A or more occurring at the time of programming.

SUMMARY OF THE INVENTION

Therefore, the object of the present invention is to provide a method of programming the flash memory cell which can reduce the size of the flash memory cell without changing the structure of the split-gate type flash memory cell and at the same time which can implement the low power device.

One aspect of the present invention to accomplish the above described object is that a minority carrier produced at a trap center of a depletion area formed in a silicon substrate is changed into a hot electron gate according to voltages respectively applied to a silicon substrate, source and drain regions, a floating gate, a control gate and select gate.

Another aspect of the present invention to accomplish the above described abject is that a depletion area formed at a source region is extended from the surface portion of a silicon substrate to the bottom of the silicon substrate, a minority carrier produced at a trap center existing at the extended depletion area receives energy from a high electric field area formed at the silicon substrate between the select gate and the floating gate so as to be changed into a hot electron, and the hot electron is injected into the floating gate by an electric field formed in vertical direction, according to voltages respectively applied to the silicon substrate, a source region, a drain region, a floating gate, a control gate and a select gate.

Another aspect of the present invention to accomplish the above described object is that a high voltage which is higher than a power source voltage is applied to the control gate, the power source voltage is applied to the drain region, a voltage which is lower than the power source voltage and higher than the ground voltage is applied to the select gate, the ground voltage is applied to the silicon substrate, and the source region is floated, so that a minority carrier produced at a trap center of a depletion region formed in the silicon substrate is changed to a hot electron and the hot electron is injected to the floating gate.

Another aspect of the present invention to accomplish the above described object is that a high voltage which is higher than a power source voltage is applied to a control gate, a voltage which is higher than the power source voltage and lower than the high voltage is applied to the drain region, a voltage which is lower than the power source voltage and higher than the ground voltage is applied to a select gate, the ground voltage is applied to the silicon substrate, and the source region is floated, so that a minority carrier produced at a trap center of a depletion region formed in said silicon substrate is changed to a hot electron and said hot electron is injected in to said floating gate.

BRIEF DESCRIPTION OF THE DRAWING

Other objects and advantages of the present invention will be understood by reading the detailed explanation of the embodiment with reference to the accompanying drawings in which.

DETAILED DESCRIPTION OF THE DRAWINGS

Figure 1:
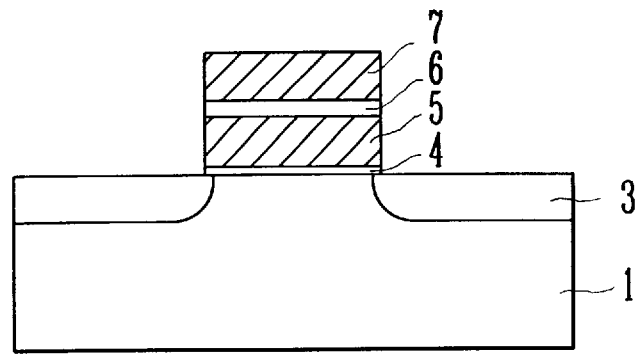
FIG. 1 is a sectional view of a conventional stack-gate type flash memory cell.
Figure 2A:
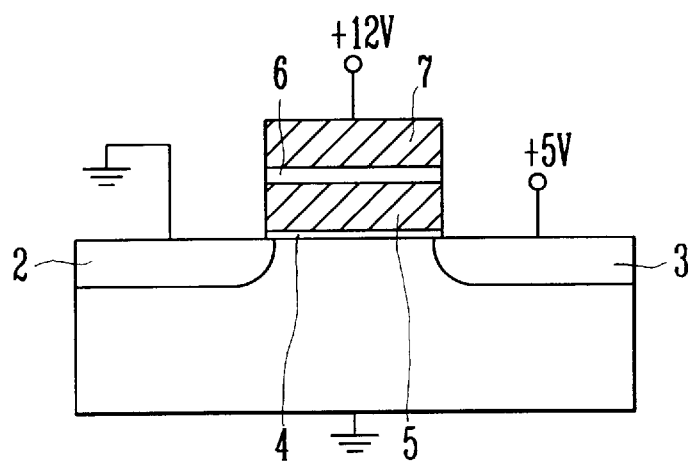
FIGS. 2A and 2B are sectional views to illustrate the operation of programming and erasing the stack-gate type flash memory cell shown in FIG. 1.
Figure 2B:
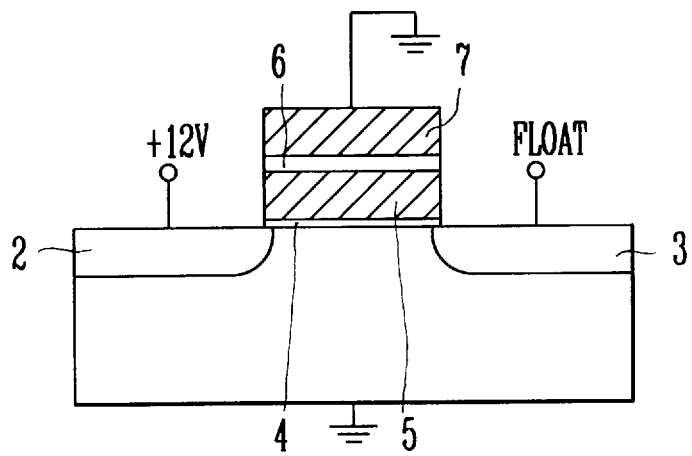
Figure 3:
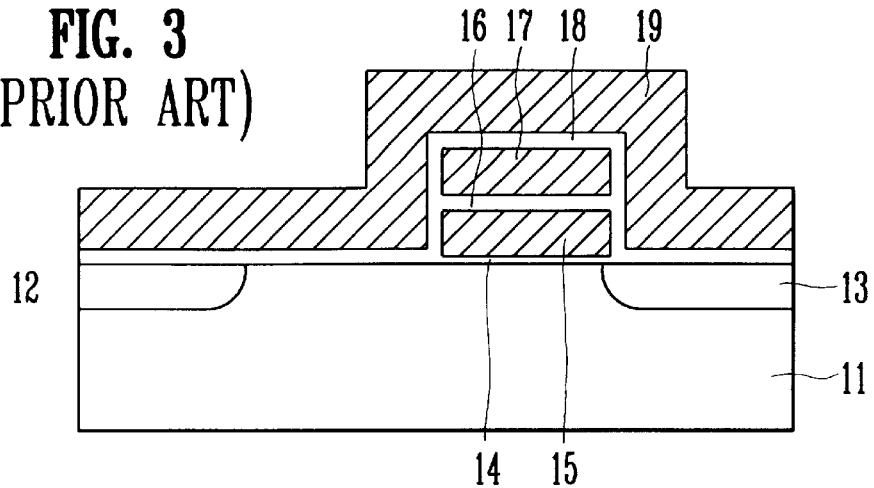
FIG. 3 is a sectional view of a conventional split-gate type flash memory cell.
Figure 4A:
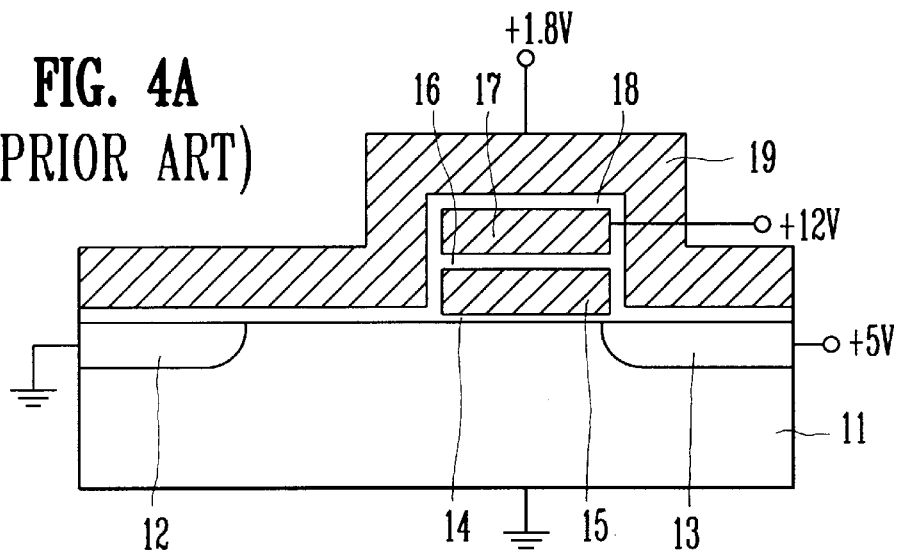
FIGS. 4A and 4B are sectional views to illustrate the operation of programming and erasing the split-gate type flash memory cell shown in FIG. 3.
Figure 4B:
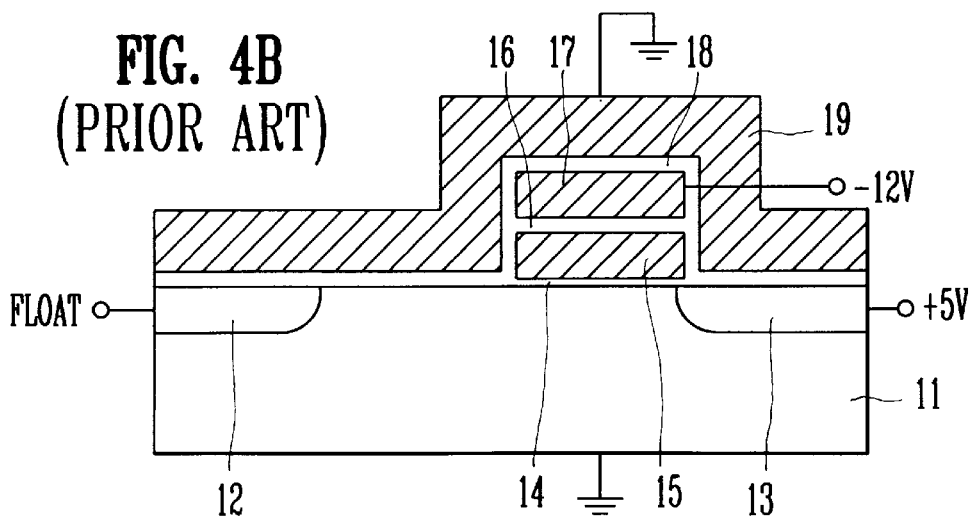

The present invention is improved from the conventional method of programming the split-gate type flash memory cell shown in FIG. 3. That is, the conventional programming method used a method in which a minority carrier flown in from the source region receives energy from the high electric field zone formed at the channel so as to be the hot electron, and the hot electron is injected into the floating gate (the channel hot electron injection method), however, the programming method of the present invention uses the bulk hot electron injection method in which a minority carrier is produced at the trap center existing at a depletion zone formed at the silicon substrate and is changed to a hot electron so as to be injected into the floating gate. Now, the method of programming the flash memory cell according to the present invention using the bulk hot electron method will be described with reference to FIG. 5

Figure 5:
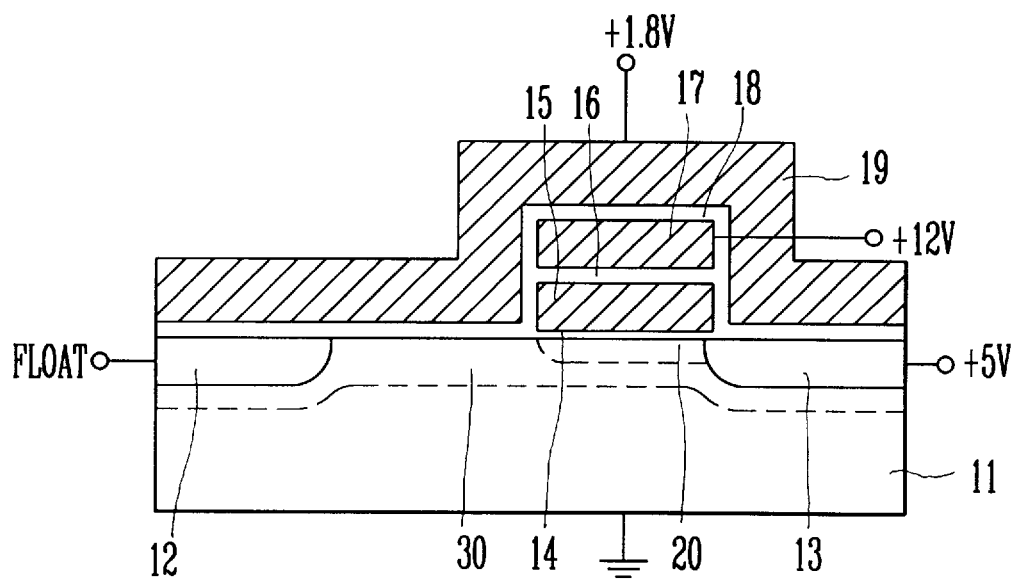
FIG. 5 is a sectional view to illustrate the method of programming the flash memory cell according to the present invention.

FIG. 5 is a sectional view to illustrate the method of programming the flash memory cell of the present invention, wherein the entire structure of the flash memory cell is identical to the structure of the general flash memory cell shown in FIG. 3, so that the description thereof is omitted.

First, to program an information to the flash memory cell, that is, to charge the floating gate 15 with an electric charge, the power source voltage of the order of +5 V is applied to the drain region 13, a high voltage of the order of +12 V which is higher than the power source voltage is applied to the control gate 17, and the ground voltage is applied to the silicon substrate 11 as show in FIG. 5. And a voltage of the order of +1.8 V which is lower than the power source voltage but higher than the ground voltage is applied to the select gate 19 and the source region 12 is floated. Then, a channel 20 is formed in the silicon substrate 11 below the floating gate 15 due to the high voltage applied to the control gate 17, and the potential applied to the drain region 13 forms an equipotential distribution at the channel 20. At this time, since the source region 12 is in the floating condition, the threshold voltage of the select channel formed in the silicon substrate 11 below the select gate 19 is increased by the body effect due to the high potential barrier of the drain region 13. Therefore, the channel inversion is not accomplished by the voltage (+1.8 V) applied to the select gate 19, so that the depletion area 30 formed at the side of the source region 12 is extended from the surface portion of the silicon substrate 11 to bottom portion thereof. At this time, to maximize the size of the depletion area 30, the concentration of impurity injected into the source region 12 must substantially be higher than that of the impurity injected into the silicon substrate 11.

The electron which is a minority carrier is produced at the trap center existing in the depletion area 30 extended as such, and the produced minority carrier receives energy from the high electrical field area formed in the silicon substrate 11 between the select gate 19 and the floating gate 15 by the voltage applied to the drain region 13 and is changed into a hot electron. Then, the hot electron is injected to the floating gate 15 through the first insulating film 14 by the vertical direction electric field formed by the high voltage applied to the control gate 17, whereby the threshold voltage $V_T$ of the flash memory cell is raised.

Figure 6A:
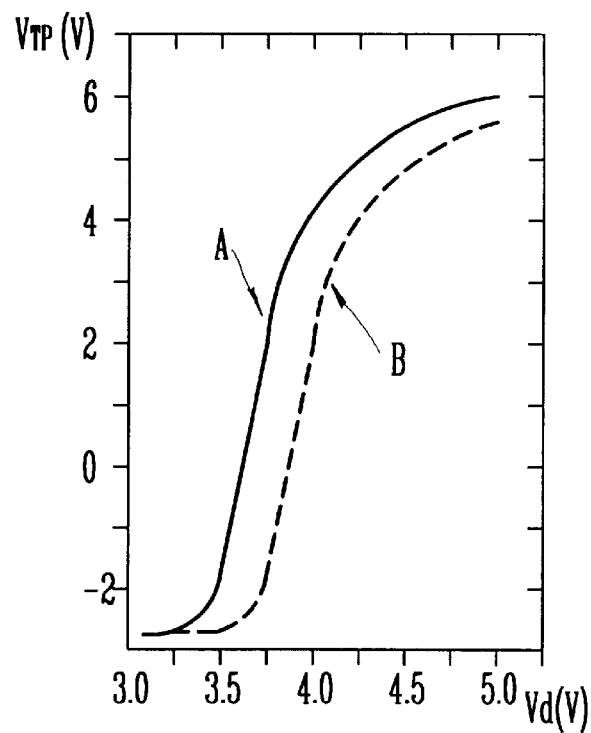
FIGS. 6A and 6B are graphs to illustrate FIG. 5.

FIG. 6A is a graph showing a change in the threshold voltage $V_{TP}$ of the flash memory cell according to the change in the voltage $V_d$ applied to the drain region 13 at the time of programming, the curve A represents the change in the threshold voltage by means of the conventional programming method and the curve B represents the change in the threshold voltage of the present invention. As shown in FIG. 6A, in case of using the programming method of the present invention, the programming characteristics is degraded, however, the strength of the electric field formed by the voltage applied to the drain region 13 is increased when compared to the case of executing the programming operation by using the conventional method, so that the programming efficiency is increased.

Figure 6B:
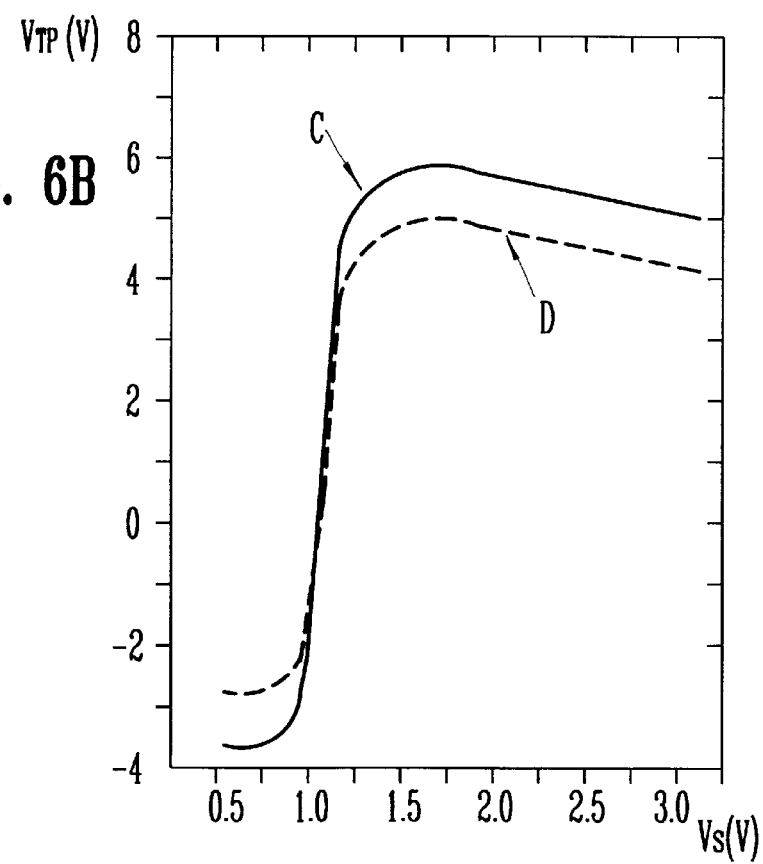

FIG. 6B is a graph showing a change in the threshold voltage $V_{TP}$ of the flash memory cell according to the change in the voltage $V_s$ applied to the select gate 19, the curve C represents the change in the threshold voltage by means of the conventional programming method and curve D represents the change in the threshold voltage by means of the programming method of the present invention. As shown in FIG. 6B, in case of using the programming method of the present invention, the programming characteristics is improved as the voltage $V_s$ is applied to the select gate 19, and this is since the size of the depletion area 30 is increased as the voltage $V_s$ applied to the select gate 19 is increased and since the production rate of the minority carrier is increased. However, in case where the voltage $V_s$ applied to the select gate 19 is increased to about +1.5 V or more, although the size of the depletion area formed at the select channel part is increased, the strength of the electric field formed by the voltage applied at the drain region 13 is decreased. Therefore, the production rate of hot electron is rapidly reduced, whereby the programming efficiency is reduced.

Consequently, to maximize the programming efficiency and characteristics, it is preferable to maintain the voltage applied to the select gate 19 and to increase the voltage applied to the drain region 13 by using the charge pumping circuit. According to the present invention, since the source region 12 is floated at the time of programming, there is no drain current so that it is possible to use the charge pumping circuit.

On the other hand, in case of increasing the voltage applied to the drain region 13 to +7 V or more which is higher than the power source voltage, it is possible to obtain the same programming characteristics if the high voltage of the order of +8 to +11 V which is higher than the power source voltage is applied to the control gate 17, and in this case, since the voltage applied to the control gate 17 is lower than +12 V, the pumping time is reduced so that the programming time is reduced. Therefore, it is possible to obtain an effect of decreasing the thickness of the second insulating film 16 formed between the control gate 17 and the floating gate 15. As a result, if the method of programming the flash memory cell according to the present invention is used, it is possible to easily implement the low power device without changing the structure of the split-gate type flash memory cell.

In addition, the flash memory cell programmed as such has an advantage in that it can be erased by the conventional method of erasing the split-gate type flash memory cell, therefore a description of the operation of erasing the flash memory cell is omitted.

As described above, according to the present invention, a low power device having an improved programming efficiency and characteristics can be easily implemented and the size of the flash memory cell is effectively reduced without changing the structure of the split-gate type flash memory cell by producing a minority carrier at the trap center existing at the extended depletion area formed at the source side and by making the produced minority carrier to receive the energy from the high electric field area formed at the silicon substrate between the select gate and floating gate by the voltage applied to the drain region so as to be the hot electron, and by injecting the hot electron into the floating gate by the vertical direction electric field formed by the high voltage applied to the control gate.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of programming a flash memory cell comprising:

extending a depletion area formed at a source region from a surface portion of a silicon substrate to a bottom portion of said silicon substrate;

producing a minority carrier at a trap center existing at said depletion area;

changing said minority carrier into a hot electron, wherein said minority carrier receives energy from a high electric field area formed at said silicon substrate between a select gate and a floating gate; and injecting said hot electron into said floating gate by an electric field formed in a vertical direction.

2. A method as in claim 1, wherein a concentration of an impurity injected into said source region is higher than that of an impurity injected into said silicon substrate.

3. The method of claim 1, wherein said minority carrier is an electron.

4. A method of programming a flash memory cell comprising:

applying a ground voltage to a silicon substrate;

floating a source region;

applying approximately 5 volts to a drain region;

applying approximately 12 volts to a control gate;

applying approximately 1.8 volts to a select gate;

changing a minority carrier produced at a trap center of a depletion region formed in said silicon substrate into a hot electron, wherein said minority carrier receives energy from a high electric field area formed at said silicon substrate between said select gate and a floating gate; and injecting said hot electron into said floating gate by an electric field formed in a vertical direction.

5. A method as in claim 4, wherein a concentration of an impurity injected into said source region is higher than that of an impurity injected into said silicon substrate.

6. The method of claim 4, wherein said minority carrier is an electron.

* * * * *